(12) United States Patent
Kagawa et al.

(10) Patent No.: US 10,431,658 B2
(45) Date of Patent: Oct. 1, 2019

(54) SILICON CARBIDE SEMICONDUCTOR DEVICE, MANUFACTURING METHOD THEREFOR AND POWER CONVERSION APPARATUS

(71) Applicant: Mitsubishi Electric Corporation, Tokyo (JP)

(72) Inventors: Yasuhiro Kagawa, Tokyo (JP); Atsushi Narazaki, Tokyo (JP); Yutaka Fukui, Tokyo (JP); Katsutoshi Sugawara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1 day.

(21) Appl. No.: 15/902,116

(22) Filed: Feb. 22, 2018

(65) Prior Publication Data

US 2019/0013385 A1    Jan. 10, 2019

(30) Foreign Application Priority Data

Jul. 5, 2017  (JP) ................. 2017-132019

(51) Int. Cl.
| | |
|---|---|
| *H01L 29/417* | (2006.01) |
| *H01L 29/78* | (2006.01) |
| *H01L 29/06* | (2006.01) |
| *H01L 29/10* | (2006.01) |
| *H01L 29/16* | (2006.01) |

(52) U.S. Cl.
CPC .... *H01L 29/41741* (2013.01); *H01L 29/0696* (2013.01); *H01L 29/1087* (2013.01); *H01L 29/1608* (2013.01); *H01L 29/7813* (2013.01)

(58) Field of Classification Search
CPC .................................................. H01L 29/41741
USPC .......................................................... 257/77
See application file for complete search history.

(56) References Cited

U.S. PATENT DOCUMENTS

| | | | |
|---|---|---|---|
| 2016/0065081 A1* | 3/2016 | Raju ................. | H02M 3/33569 363/21.1 |
| 2017/0084699 A1* | 3/2017 | Hoshi ............... | H01L 29/41741 |
| 2017/0162649 A1 | 6/2017 | Kagawa et al. | |

FOREIGN PATENT DOCUMENTS

| | | |
|---|---|---|
| JP | 2001-267570 A | 9/2001 |
| JP | 5710644 B2 | 4/2015 |

* cited by examiner

*Primary Examiner* — Hsin Yi Hsieh

(74) *Attorney, Agent, or Firm* — Studebaker & Brackett PC

(57) ABSTRACT

A gate trench and a protective trench are provided on a top surface of the silicon carbide semiconductor layer of a first conductivity type. A protective diffusion layer of a second conductivity type is provided at a position deeper than the gate electrode in the silicon carbide semiconductor layer. An inter-layer insulating film covers a surface of the gate electrode and includes a cell opening. A source electrode is electrically connected to the source region via the cell opening and electrically connected to the protective diffusion layer via the protective trench. A plated film is provided on the source electrode. A concave part is provided on a top surface of the source electrode above the protective trench. A depth in a vertical direction of the concave part is equal to or less than half of a width in a horizontal direction of the concave part.

13 Claims, 10 Drawing Sheets

SILICON CARBIDE SEMICONDUCTOR DEVICE, MANUFACTURING METHOD THEREFOR AND POWER CONVERSION APPARATUS

BACKGROUND OF THE INVENTION

Field

The present invention relates to a trench gate type silicon carbide semiconductor device, a manufacturing method therefor and a power conversion apparatus.

Background

In a trench gate type silicon semiconductor device, avalanche electric field strength of a silicon semiconductor layer is weaker than dielectric breakdown electric field strength of a gate insulating film, and therefore a withstand voltage of the semiconductor device is determined by the avalanche electric field strength of the silicon semiconductor layer. On the other hand, the avalanche electric field strength of silicon carbide is approximately ten times as strong as that of silicon, and so with a silicon carbide semiconductor device, the avalanche electric field strength of the silicon carbide semiconductor layer becomes equivalent to the dielectric breakdown electric field strength of the gate insulating film. With the trench gate type semiconductor device, when a voltage is applied to the device, an electric field is concentrated on a corner at a lower part of the trench, and so dielectric breakdown takes place in the gate insulating film in the corner of the trench first. For this reason, the withstand voltage is restricted by the electric field strength of the gate insulating film in the trench gate type silicon carbide semiconductor device.

Thus, in a conventional trench gate type silicon carbide semiconductor device, in the case of an N-channel type device, it is proposed to provide a protective diffusion layer in which p-type impurities are implanted at a high concentration in a drift layer at a lower part of the trench (e.g., see JP 2001-267570 A). Furthermore, it is proposed to connect a protective diffusion layer to a source electrode via a protective trench (e.g., see JP 5710644 B2). By grounding the protective diffusion layer in this way, it is possible to reduce concentration of the electric field on the lower part of the trench. It is further possible to prevent destruction of the gate insulating film caused by a displacement current due to a variation (dV/dt) of a drain voltage applied during switching operation.

Furthermore, a semiconductor device is used in which a heat sink or the like is soldered to an aluminum electrode on a substrate surface on which a device such as an IGBT is formed. A bump electrode using a flip chip technique is applied to such a semiconductor device. That is, a protective film is formed on the aluminum electrode and an opening is formed in this protective film. Next, a plated film for soldering is formed by plating treatment on the surface of the aluminum electrode which is overlooked from this opening.

SUMMARY

Surface electrodes are often formed by depositing a metal using a sputtering apparatus. Even when a metal is formed so as to fill an opening in a cell region, it is not possible to completely fill a wide protective trench and concave parts remain on a top surface of the surface electrode above the protective trench. Furthermore, metal particles tend to deposit on a top part rather than a bottom part of the trench and the amount of deposition increases in trench corners, and the opening of the concave part is thereby narrowed.

An opening width of an inter-layer insulating film in the cell region is the same as the width of a contact of the surface electrode, and so it is possible to control an aspect ratio of the opening. Filling the opening with tungsten or the like makes it possible to secure flatness. However, since the contact needs to be formed at the bottom of the protective trench, it is difficult to reduce the protective trench down to a size that the trench can be filled with tungsten or the like.

In plating treatment, film formation advances uniformly with respect to the surface electrode. For this reason, when plating treatment is performed on the surface electrode of the above-described shape, the plated film grown from both sides of the top part of the concave part is blocked before the plated film grown from the bottom part of the concave part arrives at the top part. This causes a cavity to be formed in the concave part and produces a remaining plated liquid. For example, when the chip becomes hot while the semiconductor device is in use, if the plating liquid trapped within the electrode evaporates and swells, a pressure may be applied to the interior of the electrode and the electrode may be damaged. For this reason, there is a problem that reliability of the apparatus deteriorates.

The present invention has been implemented to solve the above-described problem and it is an object of the present invention to provide a silicon carbide semiconductor device, a manufacturing method therefor and a power conversion apparatus capable of preventing deterioration of reliability.

According to the present invention, a silicon carbide semiconductor device includes: a silicon carbide semiconductor layer of a first conductivity type including a protective trench provided on a top surface of the silicon carbide semiconductor layer; a base region of a second conductivity type provided in an upper part of the silicon carbide semiconductor layer; a source region of the first conductivity type provided on the base region; a gate electrode provided inside a gate trench penetrating the base region and the source region via a gate insulating film; a protective diffusion layer of the second conductivity type provided at a position deeper than the gate electrode in the silicon carbide semiconductor layer; an inter-layer insulating film covering a surface of the gate electrode and including a cell opening; a source electrode electrically connected to the source region via the cell opening and electrically connected to the protective diffusion layer via the protective trench; and a plated film provided on the source electrode, wherein a concave part is provided on a top surface of the source electrode above the protective trench, and a depth in a vertical direction of the concave part is equal to or less than half of a width in a horizontal direction of the concave part.

In the present embodiment, the depth in the vertical direction of the concave part formed on the top surface of the source electrode is equal to or less than half of the width in the horizontal direction of the concave part. Therefore, it is possible to prevent formation of any cavity in the plated film and thereby prevent deterioration of reliability caused by the remaining plating liquid.

Other and further objects, features and advantages of the invention will appear more fully from the following description.

DESCRIPTION OF EMBODIMENTS

A silicon carbide semiconductor device, a manufacturing method therefor and a power conversion apparatus according to the embodiments of the present invention will be described with reference to the drawings. The same components will be denoted by the same symbols, and the repeated description thereof may be omitted.

First Embodiment

Figure 1:
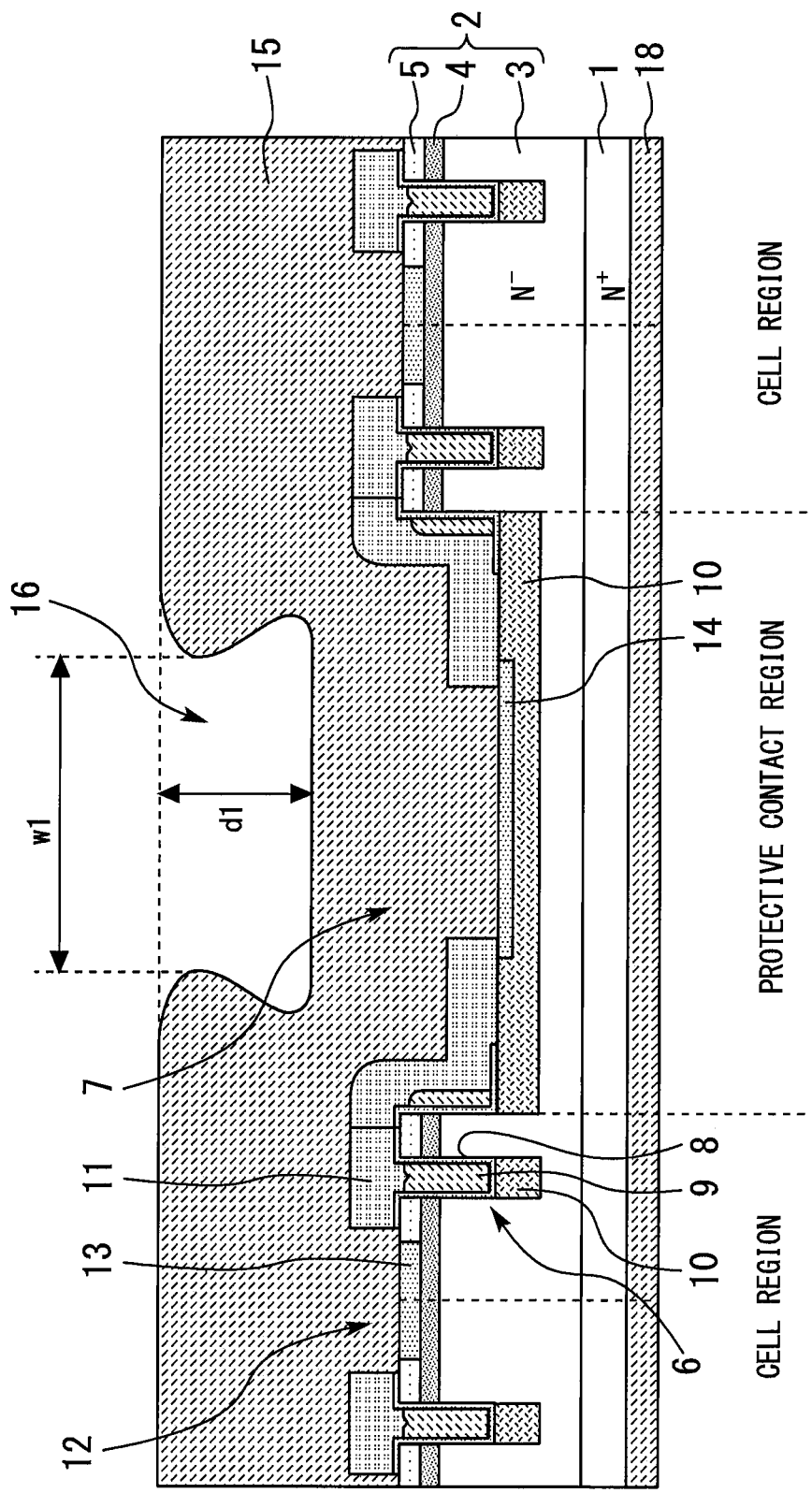
FIG. 1 and FIG. 2 are cross-sectional views illustrating a silicon carbide semiconductor device according to a first embodiment of the present invention.
Figure 2:
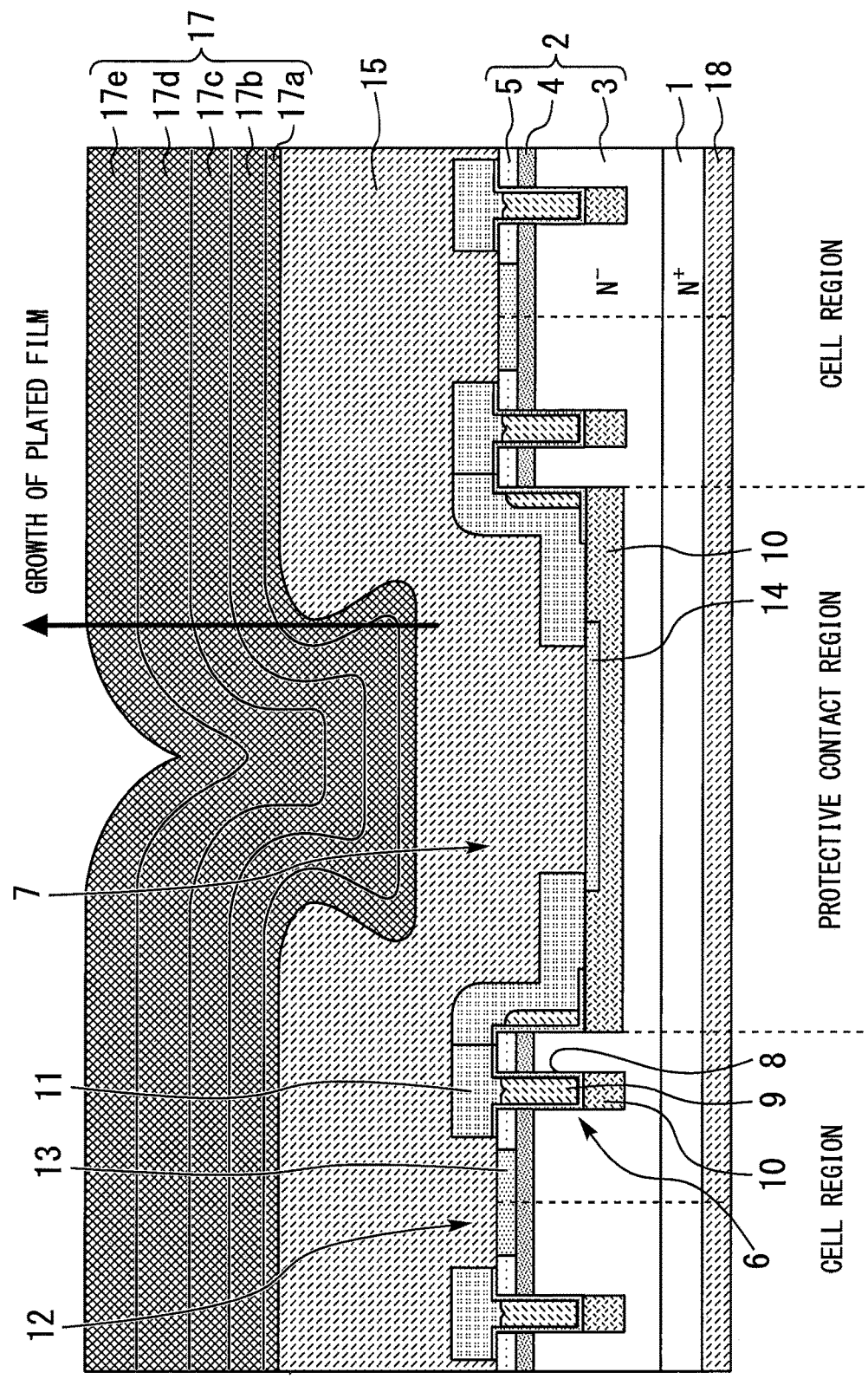

FIG. 1 and FIG. 2 are cross-sectional views illustrating a silicon carbide semiconductor device according to a first embodiment of the present invention. This silicon carbide semiconductor device is a trench gate type SiC-MOSFET. FIG. 1 shows a state before plating and FIG. 2 shows a state after the plating.

An $n^-$-type silicon carbide semiconductor layer 2 is epitaxially grown on an $n^+$-type silicon carbide substrate 1. A lower part of the silicon carbide semiconductor layer 2 is a drift layer 3 and a p-type base region 4 is provided in an upper part of the silicon carbide semiconductor layer 2. An n-type source region 5 is provided on the base region 4.

A gate trench 6 is formed on the top surface of the silicon carbide semiconductor layer 2 so as to penetrate the base region 4 and the source region 5, and a protective trench 7 is also provided. The protective trench 7 has a square or rectangular shape in a plan view. The bottom part of the gate trench 6 reaches the drift layer 3. A gate insulating film 8 is provided on a bottom surface and an inner surface of the gate trench 6. A gate electrode 9 is provided inside the gate trench 6 via the gate insulating film 8. The gate electrode 9 is also formed at a peripheral portion of the protective trench 7.

The gate electrode 9 is disposed in a grid shape in a plan view. A plurality of MOSFET cells sectioned by the grid-shaped gate electrode 9 are formed in the silicon carbide semiconductor layer 2. Each cell includes the base region 4, the source region 5 and the gate electrode 9, and functions as a MOSFET. A region in which a plurality of such cells are provided is a cell region. On the other hand, a region in which the protective trench 7 is provided is a protective contact region.

P-type protective diffusion layers 10 are provided at a bottom part of the gate trench 6 and at a bottom part of the protective trench 7 in the silicon carbide semiconductor layer 2, and are connected to each other in the p-type region. Just like the gate electrode 9, the protective diffusion layer 10 is also disposed in a grid shape in a plan view. Therefore, the protective diffusion layer 10 at the bottom part of the protective trench 7 is connected to all the protective diffusion layers 10 of surrounding MOSFET cells.

An inter-layer insulating film 11 made of TEOS covers the surface of the gate electrode 9. In the cell region, the inter-layer insulating film 11 is provided with a cell opening 12. In the cell opening 12, a $p^+$-type contact region 13 is provided at a top part on the base region 4. The inter-layer insulating film 11 is also provided in the protective trench 7 and is opened at the bottom surface of the protective trench 7. In this opening, a $p^+$-type contact region 14 is provided at a top part on the protective diffusion layer 10.

A source electrode 15 is provided on the inter-layer insulating film 11. The source electrode 15 is electrically connected to the source region 5 via the cell opening 12 to form a contact. Furthermore, the source electrode 15 is electrically connected to the protective diffusion layer 10 via the protective trench 7 to form a protective contact. That is, the cell opening 12 is a contact hole for connecting the source electrode 15 and the source region 5 and the protective trench 7 is a contact hole for connecting the source electrode 15 and the protective diffusion layer 10.

The protective trench 7 is formed on a substantially whole block sectioned by the gate electrode 9. In the protective trench 7, the source electrode 15 which is the protective contact is insulated from the gate electrode 9 by the inter-layer insulating film 11. This allows the area of the protective contact to increase to a maximum, making it possible to reduce the resistance of the protective contact.

A concave part 16 is formed on the top surface of the source electrode 15 above the protective trench 7. The width of the protective trench 7 is adjusted such that a depth d1 in the vertical direction of the concave part 16 of the source electrode 15 becomes equal to or less than half of a width w1 in the horizontal direction at the top of the concave part 16 (w1≥2×d1). A plated film 17 is provided on the source electrode 15. The plated film 17 fills the concave part 16 of the source electrode 15. For this reason, there is no need to provide another metal material in the concave part 16. A drain electrode 18 is provided on an undersurface of the silicon carbide substrate 1.

Next, operation of the silicon carbide semiconductor device according to the present embodiment will be described briefly. When a positive voltage equal to or higher than a threshold voltage is applied to the gate electrode 9, an inverted channel layer is formed in the base region 4 on a side face of the gate electrode 9. This inverted channel layer forms a path along which electrons flow from the source region 5 to the drift layer 3 as carriers. Electrons flowing from the source region 5 through the inverted channel layer into the drift layer 3, pass through the silicon carbide substrate 1 following an electric field produced by a positive voltage of the drain electrode 18 and reach the drain electrode 18. As a result, the MOSFET allows a current to flow from the drain electrode 18 to the source electrode 15. Such a state is an on-state of the MOSFET. The protective diffusion layer 10 at the bottom part of the gate trench 6 promotes depletion of the drift layer 3 when the MOSFET is turned off, and alleviates concentration of an electric field on the bottom part of the gate trench 6 to thereby prevent destruction of the gate insulating film 8.

On the other hand, when a voltage lower than the threshold voltage is applied to the gate electrode 9, no inverted channel is formed in the channel region, and so no current flows between the drain electrode 18 and the source electrode 15. This state is an off-state of the MOSFET. As described above, when the MOSFET is turned off, the voltage of the drain electrode 18 drastically increases, and so a displacement current flows into the protective diffusion layer 10 via a parasitic capacitance between the protective diffusion layer 10 and the drift layer 3. A voltage drop occurs in a resistance component between the protective diffusion layer 10 and the base region 4 at this time, and when the voltage drop increases, dielectric breakdown occurs in the gate insulating film 8. Thus, the width of the protective trench 7 is made greater than the width of the cell opening 12. The width of the protective trench 7 is preferably greater than the width of one cell. More specifically, the width of the protective trench 7 is more than twice the width of the cell opening 12 and is 7 µm or more. For this reason, it is possible to make the protective contact formation area greater and make the resistance value of the protective contact smaller. Thus, the resistance value between the protective diffusion layer 10 and the base region 4 decreases, making it possible to prevent destruction of the gate insulating film 8 caused by a displacement current.

Next, a manufacturing method for the silicon carbide semiconductor device according to the present embodiment will be described. First, the silicon carbide semiconductor layer 2 is made to epitaxially grow on the 4H poly-type n-type low-resistance silicon carbide substrate 1 using a chemical vapor deposition (CVD) method. The silicon carbide semiconductor layer 2 has an impurity concentration of $1 \times 10^{15}$ cm$^{-3}$ to $1 \times 10^{17}$ cm$^{-3}$ and a thickness of 5 to 50 µm.

Next, the base region 4 is formed by implanting aluminum (Al) ions into the surface of the silicon carbide semiconductor layer 2. The depth of Al ion implantation is set to about 0.5 to 3 µm within a range not exceeding the thickness of the silicon carbide semiconductor layer 2. The impurity concentration of implanted Al is set to be higher than n-type impurity concentration of the silicon carbide semiconductor layer 2. The region of the silicon carbide semiconductor layer 2 deeper than this Al implantation depth remains as an n-type drift layer 3. Note that the base region 4 may be formed by epitaxial growth. The impurity concentration and thickness of the base region 4 are assumed to be equivalent to those in a case where the base region 4 is formed by ion implantation.

Next, the source region 5 is formed by implanting nitrogen (N) ions into the surface of the base region 4. The source region 5 is formed in a grid pattern corresponding to a layout of the gate electrode 9 to be formed hereinafter. Thus, when the gate electrode 9 is formed, the source regions 5 are disposed on both sides of the gate electrode 9. The depth of N ion implantation is made smaller than the thickness of the base region 4. The impurity concentration of N to be implanted is made higher than the concentration of p-type impurity of the base region 4 and set to a range of $1 \times 10^{18}$ cm$^{-3}$ to $1 \times 10^{21}$ cm$^{-3}$.

Next, a silicon oxide film layer having a thickness of about 1 to 2 µm is deposited onto the silicon carbide semiconductor layer 2 and a resist pattern is formed thereon using a photolithography technique. A silicon oxide film is patterned by reactive ion etching (RIE) using this resist pattern as a mask. The gate trench 6 penetrating the source region 5 and the base region 4 is formed in the silicon carbide semiconductor layer 2 by RIE using the patterned silicon oxide film layer as a mask. In this case, the protective trench 7 is also formed in the protective contact region simultaneously. The depths of the gate trench 6 and the protective trench 7 are equal to or greater than the depth of the base region 4, and are set to about 0.5 to 3 µm.

Next, an implantation mask, portions corresponding to the gate trench 6 and the protective trench 7 of which are left open, is formed and Al ions are implanted using the implantation mask as a mask and the p-type protective diffusion layer 10 is formed at the bottom parts of the gate trench 6 and the protective trench 7. Note that instead of the implantation mask, the silicon oxide film used as a mask to form the trench may also be used. This makes it possible to simplify the manufacturing step and reduce the cost. In this case, it is necessary to adjust the thickness of the silicon oxide film layer and etching conditions so that a certain degree of thickness remains after forming the gate trench 6 and the protective trench 7.

After removing the implantation mask, annealing for activating N and Al ions implanted in the above-described step is performed using a heat treatment apparatus. This annealing is performed in an inert gas atmosphere such as an argon (Ar) gas under conditions of 1300 to 1900° C. for 30 seconds to 1 hour.

Next, a silicon oxide film is formed on the whole surface of the silicon carbide semiconductor layer 2 including interiors of the gate trench 6 and the protective trench 7, polysilicon is then deposited using a decompression CVD method, these are patterned or etched back to thereby form the gate insulating film 8 and the gate electrode 9 in the gate trench 6 and the protective trench 7. The gate electrode 9 is embedded in the whole gate trench 6 in the MOSFET cell region. On the other hand, the gate electrode 9 at the center is removed in the protective trench 7 of the protective contact region and patterning or etch back is performed so that the gate electrode 9 remains only in the peripheral portion. Note that the silicon oxide film which becomes the gate insulating film 8 may be formed by thermally oxidizing the surface of the silicon carbide semiconductor layer 2 or may be deposited on the silicon carbide semiconductor layer 2.

Next, the inter-layer insulating film 11 is formed over the whole surface using a decompression CVD method to cover the gate electrode 9. The inter-layer insulating film 11 is then patterned to form the cell opening 12 and the opening at the bottom part of the protective trench 5. Next, an electrode member such as an Al alloy is deposited to form the source electrode 15 on the inter-layer insulating film 11 and inside the cell opening 12 and inside the opening through sputtering.

Next, the plated film 17 is formed on the source electrode 15 by plating treatment. An arrow in FIG. 2 indicates a growth direction of the plated film 17. First, when the plating treatment starts, a plated film 17a grows uniformly with respect to the top surface of the source electrode 15. Plated films 17b and 17c grown from the bottom part of the concave part 16 grow so as to fill the concave part 16. The growth further advances and a plated film 17d reaches the top of the source electrode 15. After that, growth of a plated film 17e advances so as to fill the concave part 16 of the source electrode 15. Thus, before the plated film 17 grown from both sides at the top of the concave part 16 is blocked, the plated film 17 grown from the bottom part of the concave part 16 reaches the top, and so this prevents cavities from being formed in the plated film 17.

Finally, an electrode member such as an Al alloy is deposited onto the undersurface of the silicon carbide substrate 1 to form the drain electrode 18. The silicon carbide semiconductor device according to the present embodiment is manufactured in the above-described steps.

Figure 3:
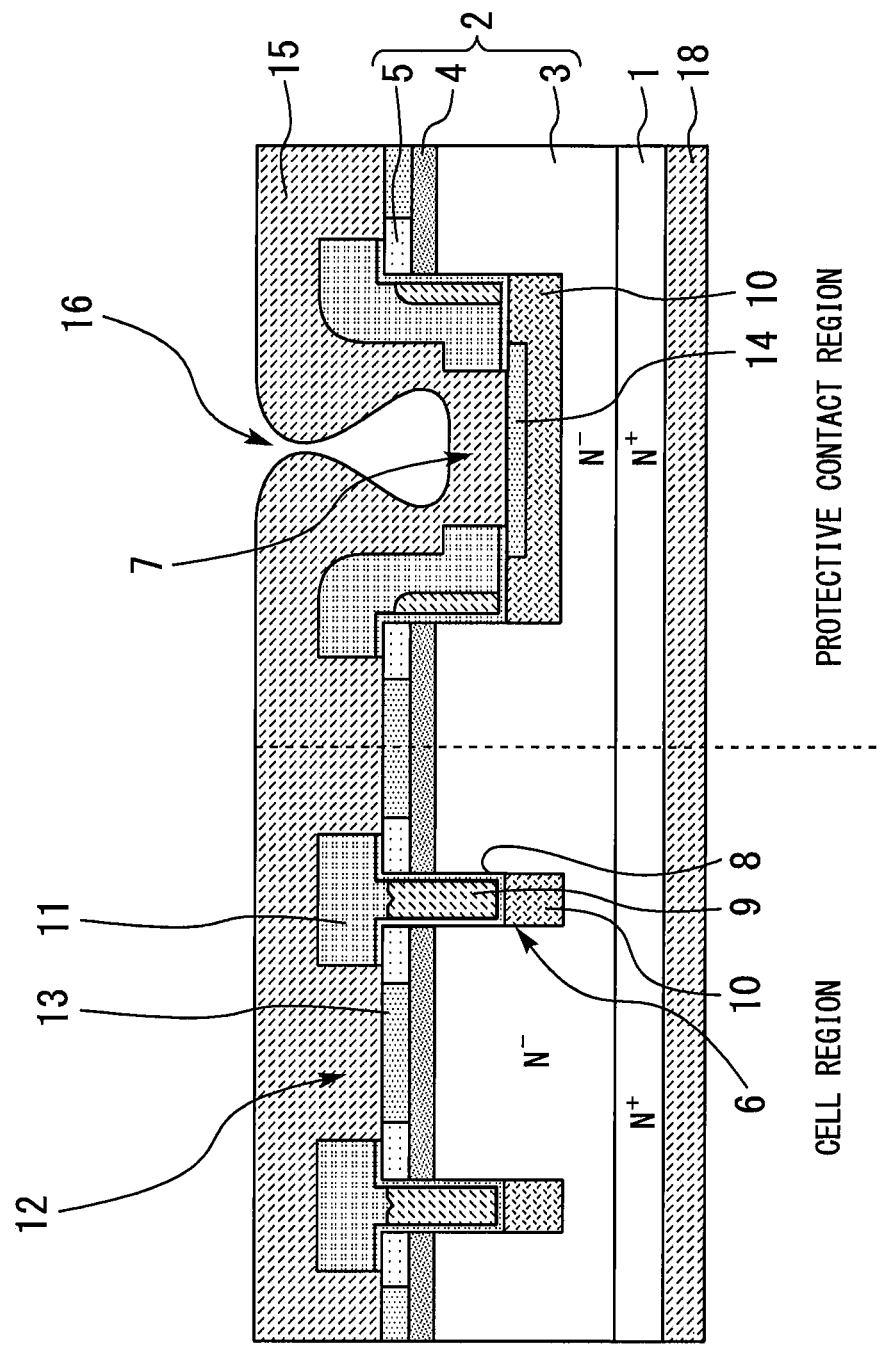
FIG. 3 and FIG. 4 are cross-sectional views illustrating a silicon carbide semiconductor device according to a comparative example.
Figure 4:
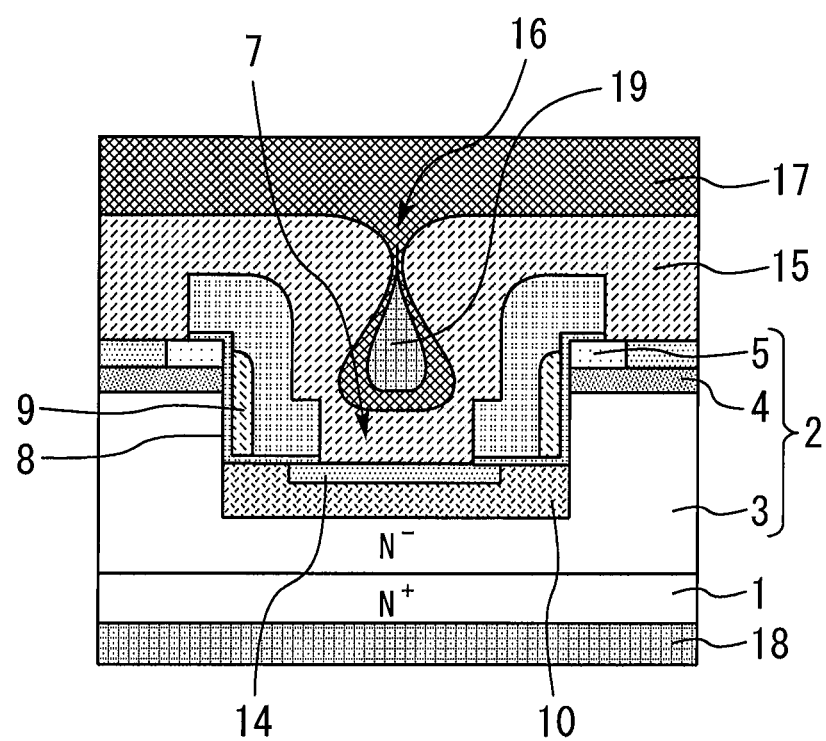

Next, effects of the present embodiment will be described in comparison with a comparative example. FIG. 3 and FIG. 4 are cross-sectional views illustrating a silicon carbide semiconductor device according to a comparative example. FIG. 3 illustrates a state before plating and FIG. 4 illustrates a state after the plating. In the comparative example, since the depth of the concave part 16 of the source electrode 15 is greater than the width, a cavity is created in the plated film 17, and a remaining plating liquid 19 is thereby generated.

In contrast, according to the present embodiment, the depth in the vertical direction of the concave part 16 formed on the top surface of the source electrode 15 above the protective trench 7 is equal to or less than half of the width in the horizontal direction of the concave part 16. By adjusting the size of the concave part 16 in this way, the plated film 17 grown from the bottom part of the concave part 16 reaches the top part before the plated film 17 grown from both sides at the top of the concave part 16 is blocked. Therefore, it is possible to prevent formation of any cavity in the plated film 17 and thereby prevent deterioration of reliability caused by the remaining plating liquid.

Note that the protective diffusion layer 10 at the bottom part of the gate trench 6 need not always be provided along the bottom part of the gate trench 6, but needs only to be provided at a position deeper than the gate electrode 9. For example, the protective diffusion layer 10 may be provided between the neighboring gate trenches 6 in a cross-sectional view. The protective diffusion layer 10 may be provided only at a part of the bottom part of the gate trench 6 instead of being provided at the whole bottom part of the gate trench 6 from one end to the other end thereof. Alternatively, the protective diffusion layer 10 may be configured to stick out from the bottom part of the gate trench 6. That is, the protective diffusion layer 10 may be provided at a position deeper than the gate electrode 9 in the silicon carbide semiconductor layer and extend up to at least the bottom part of the protective trench. In this way, it is possible to achieve relaxation of the electric field at the bottom part of the gate trench 6 and also make a connection with the source electrode 7 via the protective trench.

Note that the concave part is also formed at the top surface of the plated film 17 above the protective trench 7. Furthermore, although the top surface of the plated film 17 is flat above the cell opening 12 in the figure, the top surface of the plated film 17 may not be flat just like above the protective trench 7.

Second Embodiment

Figure 5:
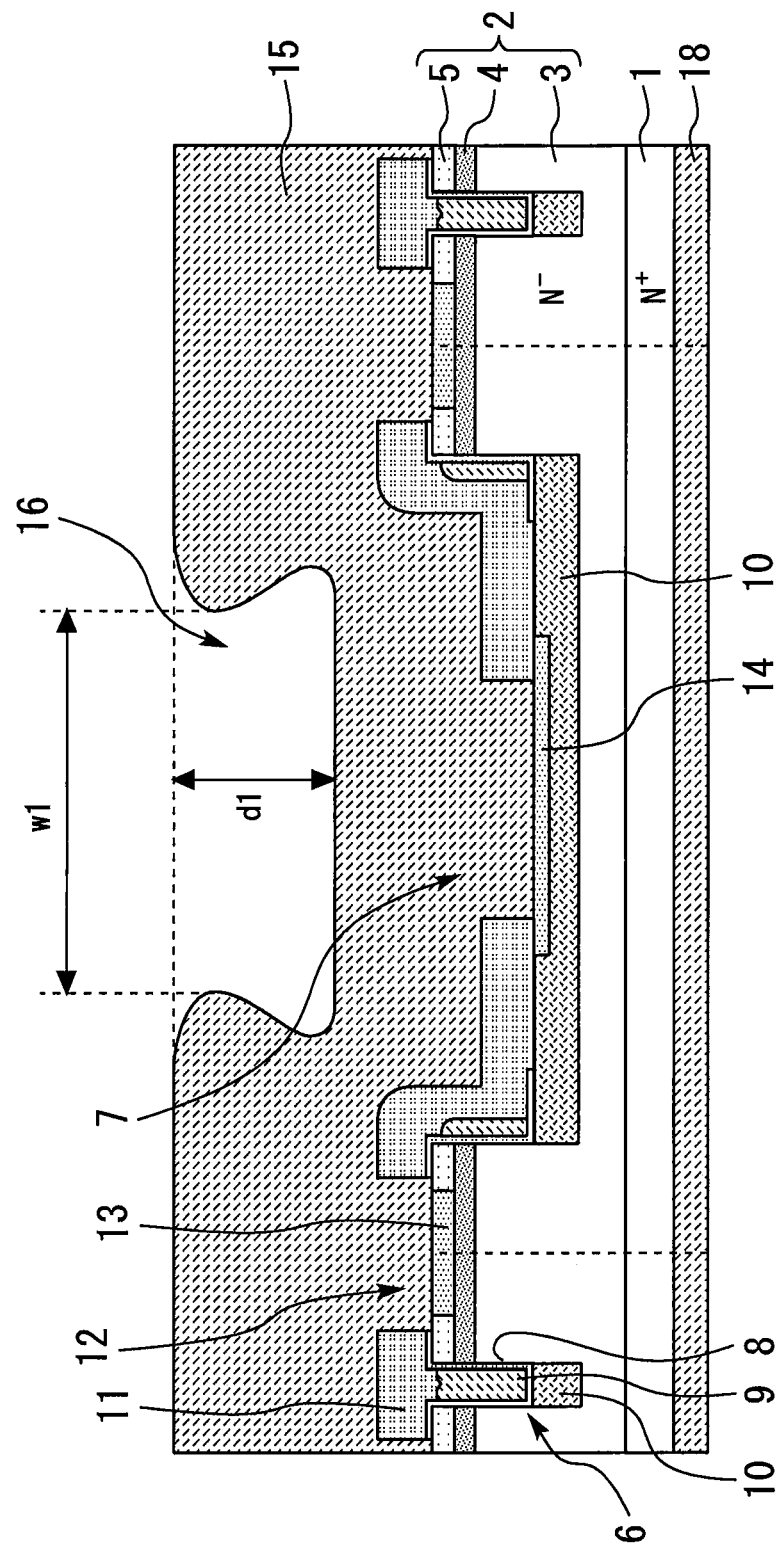
FIG. 5 is a cross-sectional view illustrating a silicon carbide semiconductor device according to a second embodiment of the present invention.
Figure 6:
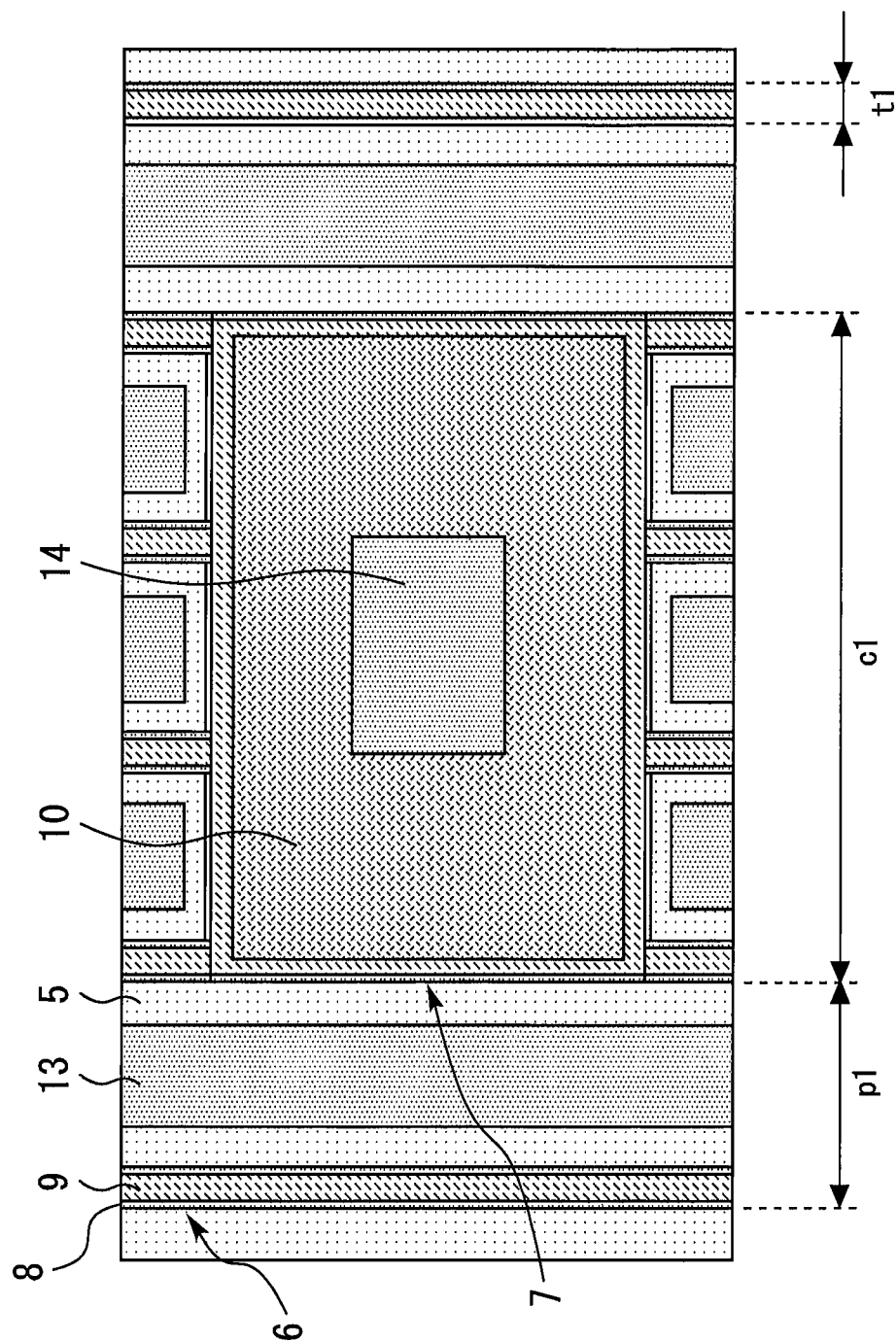
FIG. 6 is a plan view illustrating the silicon carbide semiconductor device according to the second embodiment of the present invention.

FIG. 5 is a cross-sectional view illustrating a silicon carbide semiconductor device according to a second embodiment of the present invention. FIG. 6 is a plan view illustrating the silicon carbide semiconductor device according to the second embodiment of the present invention. In the present embodiment, the width of the protective trench 7 is adjusted so that no gate electrode 9 is located between the cell opening 12 adjacent to the protective trench 7 and the protective trench 7.

For example, when it is assumed that the width of the gate trench 6 of the cell region is t1, the pitch of the adjacent gate trenches 6 is p1, and n is an integer of 1 or greater, a width c1 of the protective trench 7 is c1=p1×n+t1. Therefore, the width c1 of the protective trench 7 is an integer multiple of the width of one cell. However, errors in a manufacturing process is allowed. Here, t1 is 0.5 to 2.0 μm and p1 is about 3.0 to 10 μm.

Figure 7:
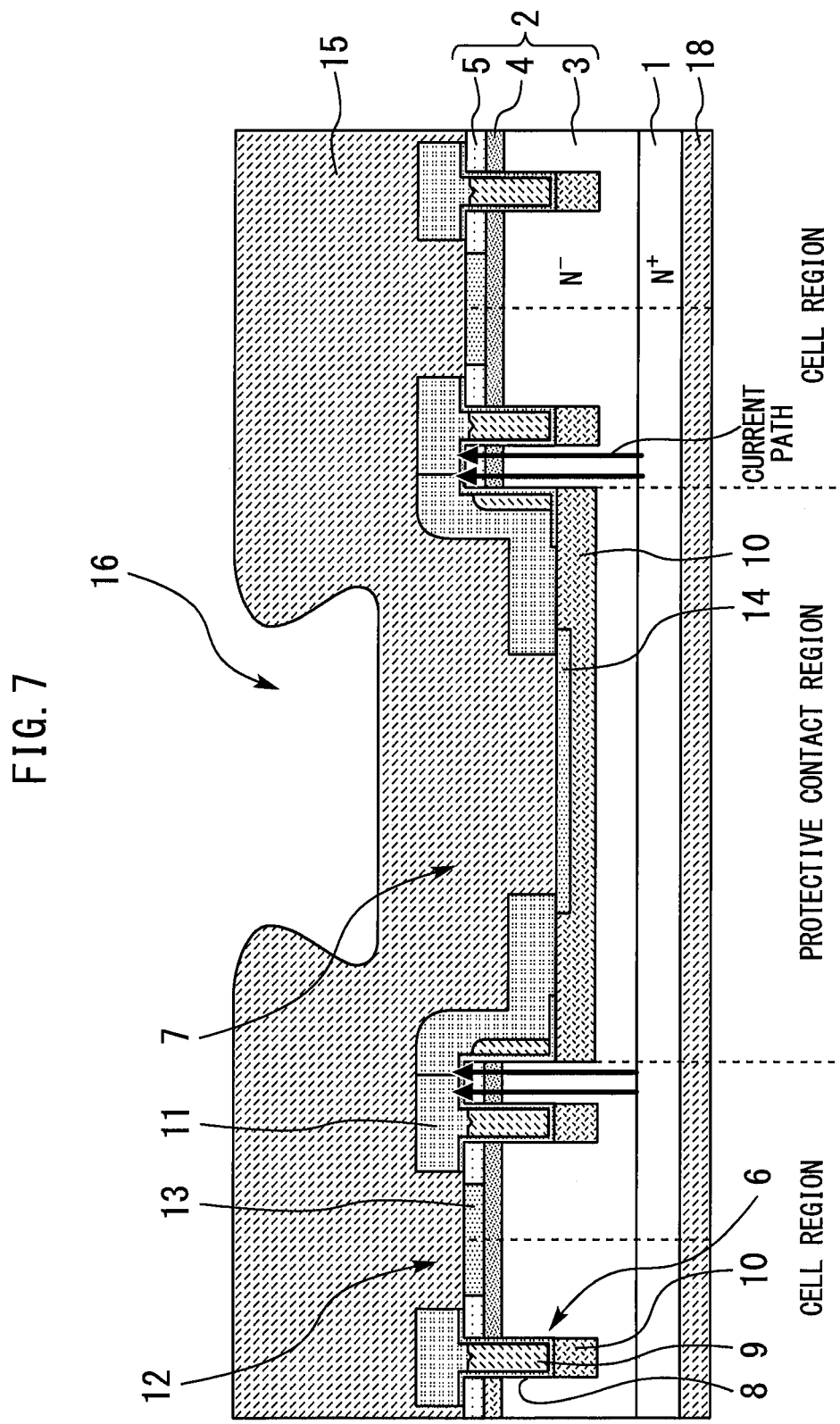
FIG. 7 is a cross-sectional view illustrating a current flow of the silicon carbide semiconductor device according to the first embodiment of the present invention.
Figure 8:
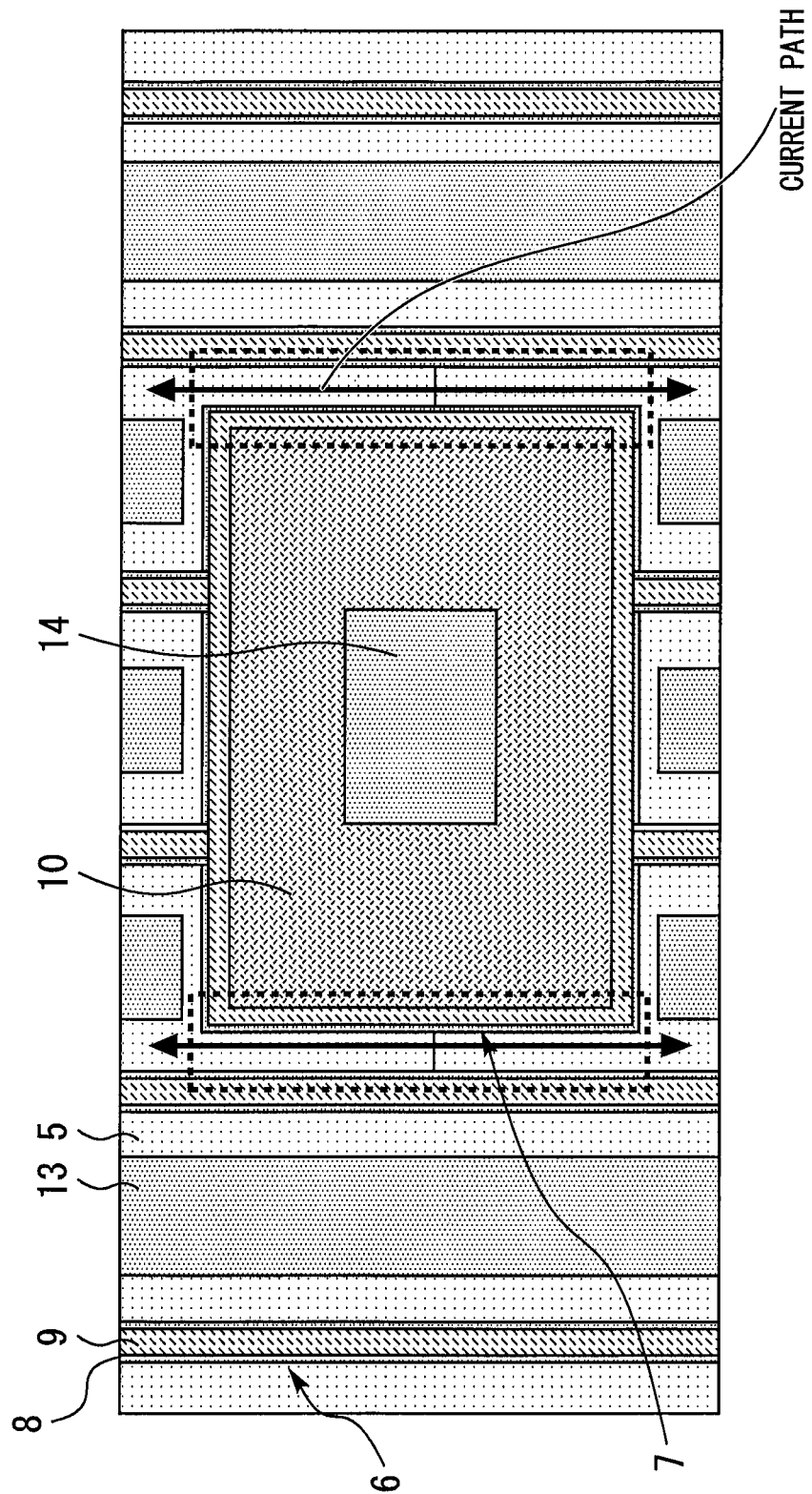
FIG. 8 is a plan view illustrating a current flow of the silicon carbide semiconductor device according to the first embodiment of the present invention.

Next, effects of the present embodiment will be described in comparison with the first embodiment. FIG. 7 is a cross-sectional view illustrating a current flow of the silicon carbide semiconductor device according to the first embodiment of the present invention. FIG. 8 is a plan view illustrating a current flow of the silicon carbide semiconductor device according to the first embodiment of the present invention. The protective trench 7 is located adjacent to the gate electrode 9 in regions enclosed by square-dotted lines, and since the interval between the two is small, it is difficult to form the cell opening 12. When a transistor is turned on, a channel is formed between a side wall of the protective trench 7 and an opposite side wall of the gate electrode 9, and a current flowing through this channel flows along a path shown by an arrow in the figure. Source resistance around the protective contact region increases dependent on the length of the current path and the amount of current is restricted. Therefore, there is a possibility that the current may become nonuniform in the cell region and the temperature distribution may become nonuniform.

In contrast, in the present embodiment, there is no gate electrode 9 between the cell opening 12 adjacent to the protective trench 7 and the protective trench 7. Therefore, the cell opening 12 is formed in the vicinity of the region in which a channel is formed. For this reason, it is possible to make the current path uniform and solve nonuniformity of current in the cell region. The rest of the configuration and effects are similar to those of the first embodiment.

Third Embodiment

Figure 9:
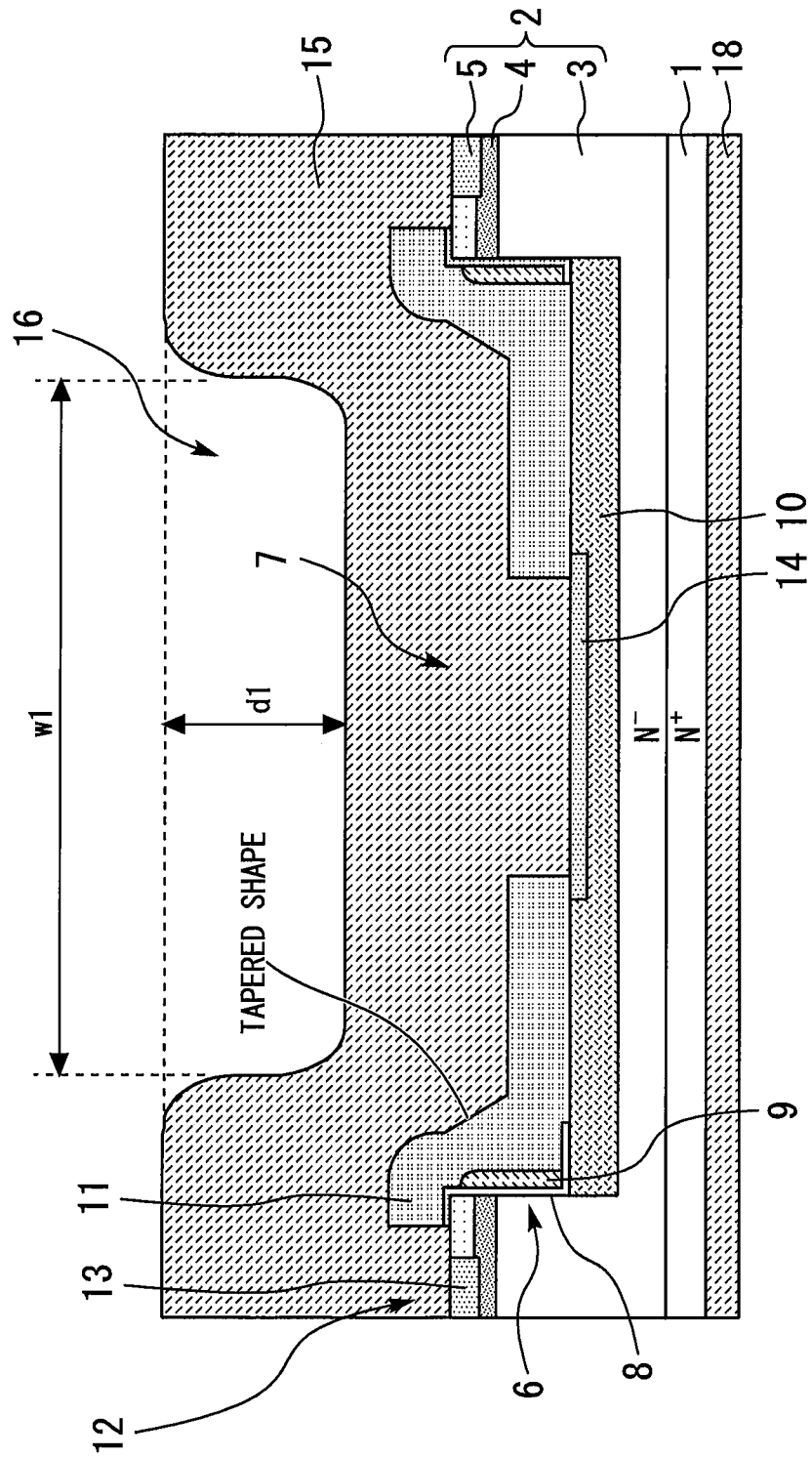
FIG. 9 is a cross-sectional view illustrating a silicon carbide semiconductor device according to a third embodiment of the present invention.

FIG. 9 is a cross-sectional view illustrating a silicon carbide semiconductor device according to a third embodiment of the present invention. In the present embodiment, the inter-layer insulating film 11 provided on the side wall of the protective trench 7 is tapered. Using BPSG or the like as a material of the inter-layer insulating film 11, it is possible to cause its shape to change through heat treatment and form the inter-layer insulating film 11 into a tapered shape. Thus, when the source electrode 15 is formed, it is possible to eliminate dents in the side wall of the protective trench 7 and widen an opening width w1 at the top of the concave part 16 of the source electrode 15. Therefore, the width of the protective trench 7 can be reduced and the protective contact region that does not function as the channel can be reduced. As a result, it is possible to increase the current path in size and reduce its on-resistance. The rest of the configuration and effects are similar to those of the first and second embodiments.

Fourth Embodiment

In this embodiment, the silicon carbide semiconductor devices according to the first to third embodiments described above are applied to an electric power conversion device. The electric power conversion device is, for example, an inverter device, a converter device, a servo amplifier, or a power supply unit. Although the present invention is not limited to a specific electric power conversion device, a case where the present invention is applied to a three-phase inverter will be described below.

Figure 10:
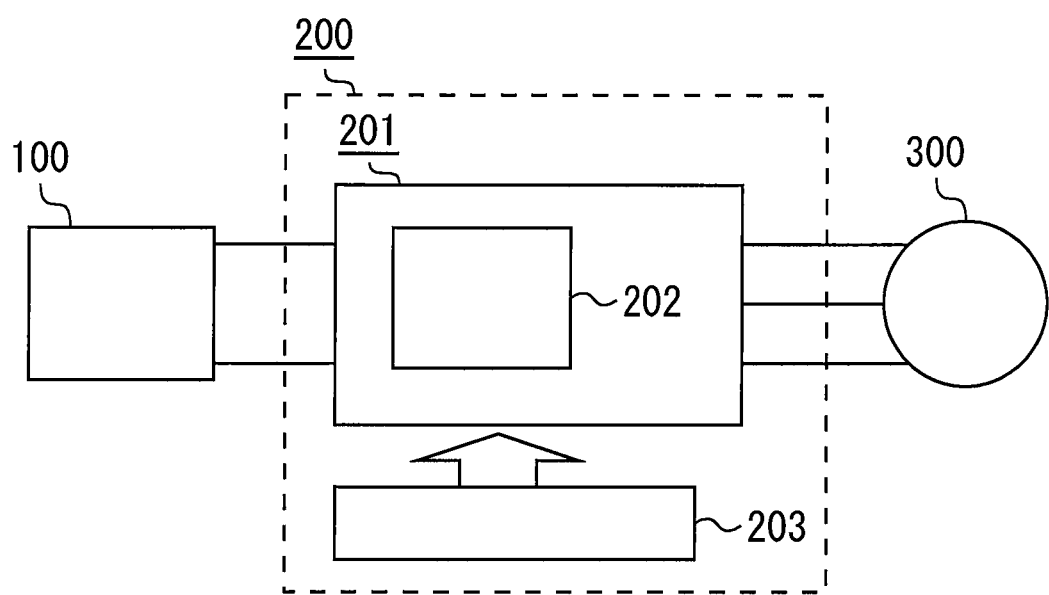
FIG. 10 is a block diagram illustrating a configuration of an electric power conversion system to which the electric power conversion device according to the fourth embodiment is applied.

FIG. 10 is a block diagram illustrating a configuration of an electric power conversion system to which the electric power conversion device according to the fourth embodiment is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a silicon carbide semiconductor device 202 corresponding to any one of the first to third embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the silicon carbide semiconductor device 202. Another drive circuit different from the silicon carbide semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the silicon carbide semiconductor devices according to the first to third embodiments are applied as the semiconductor device 202. Accordingly, it is possible to obtain a highly reliable power conversion device.

While this embodiment illustrates an example in which the present invention is applied to a two-level three-phase inverter, the present invention is not limited to this and can be applied to various electric power conversion devices. While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the load may be used as a power conditioner for a photovoltaic power generating system, an electricity storage system, or the like.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-132019, filed on Jul. 5, 2017 including specification, claims, drawings and summary, on which the Convention priority of the present application is based, is incorporated herein by reference in its entirety.

The invention claimed is:
1. A silicon carbide semiconductor device comprising:
   a silicon carbide semiconductor layer of a first conductivity type including a protective trench provided on a top surface of the silicon carbide semiconductor layer;
   a base region of a second conductivity type provided in an upper part of the silicon carbide semiconductor layer;
   a source region of the first conductivity type provided on the base region;
   a gate electrode provided inside a gate trench penetrating the base region and the source region via a gate insulating film;

a protective diffusion layer of the second conductivity type provided at a position deeper than the gate electrode in the silicon carbide semiconductor layer;
an inter-layer insulating film covering a surface of the gate electrode and including a cell opening;
a source electrode electrically connected to the source region via the cell opening and electrically connected to the protective diffusion layer via the protective trench; and
a plated film provided on the source electrode,
wherein a concave part is provided on a top surface of the source electrode directly above the protective trench,
a depth in a vertical direction of the concave part is equal to or less than half of a width in a horizontal direction of the concave part, and
the plated film fills the concave part of the source electrode.

2. The silicon carbide semiconductor device according to claim 1, wherein a width of the protective trench is greater than a width of the cell opening.

3. The silicon carbide semiconductor device according to claim 2, wherein a plurality of cells are provided in the silicon carbide semiconductor layer,
each of the cells include the base region, the source region and the gate electrode, and
a width of the protective trench is greater than a width of one cell.

4. The silicon carbide semiconductor device according to claim 1, wherein the gate electrode is not provided between the cell opening adjacent to the protective trench and the protective trench.

5. The silicon carbide semiconductor device according to claim 2, wherein the gate electrode is not provided between the cell opening adjacent to the protective trench and the protective trench.

6. The silicon carbide semiconductor device according to claim 3, wherein the gate electrode is not provided between the cell opening adjacent to the protective trench and the protective trench.

7. The silicon carbide semiconductor device according to claim 4, wherein a plurality of cells are formed in the silicon carbide semiconductor layer,
each of the cells include the base region, the source region and the gate electrode, and
a width of the protective trench is an integer multiple of a width of one cell.

8. The silicon carbide semiconductor device according to claim 5, wherein a plurality of cells are formed in the silicon carbide semiconductor layer,
each of the cells include the base region, the source region and the gate electrode, and
a width of the protective trench is an integer multiple of a width of one cell.

9. The silicon carbide semiconductor device according to claim 6, wherein a plurality of cells are formed in the silicon carbide semiconductor layer,
each of the cells include the base region, the source region and the gate electrode, and
a width of the protective trench is an integer multiple of a width of one cell.

10. The silicon carbide semiconductor device according to claim 1, wherein the inter-layer insulating film provided on a side wall of the protective trench is tapered.

11. The silicon carbide semiconductor device according to claim 2, wherein the inter-layer insulating film provided on a side wall of the protective trench is tapered.

12. The silicon carbide semiconductor device according to claim 3, wherein the inter-layer insulating film provided on a side wall of the protective trench is tapered.

13. An electric power conversion device comprising:
a main conversion circuit including the silicon carbide semiconductor device according to claim 1, converting input power and outputting the converted power; and
a control circuit outputting a control signal for controlling the main conversion circuit to the main conversion circuit.

* * * * *